(12) United States Patent
Yatsuda et al.

(10) Patent No.: US 11,171,050 B2
(45) Date of Patent: Nov. 9, 2021

(54) METHOD FOR MANUFACTURING A CONTACT PAD, METHOD FOR MANUFACTURING A SEMICONDUCTOR DEVICE USING SAME, AND SEMICONDUCTOR DEVICE

(71) Applicant: Tokyo Electron Limited, Tokyo (JP)

(72) Inventors: Koichi Yatsuda, Tokyo (JP); Takashi Hayakawa, Tokyo (JP); Mitsuaki Iwashita, Kumamoto (JP); Takashi Tanaka, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 89 days.

(21) Appl. No.: 16/491,678

(22) PCT Filed: Feb. 27, 2018

(86) PCT No.: PCT/JP2018/007230
§ 371 (c)(1),
(2) Date: Sep. 6, 2019

(87) PCT Pub. No.: WO2018/163913
PCT Pub. Date: Sep. 13, 2018

(65) Prior Publication Data
US 2020/0035553 A1    Jan. 30, 2020

(30) Foreign Application Priority Data

Mar. 9, 2017 (JP) .............................. JP2017-044808

(51) Int. Cl.
*H01L 21/768* (2006.01)
*H01L 23/522* (2006.01)
*H01L 23/528* (2006.01)
*H01L 27/11556* (2017.01)
*H01L 27/11582* (2017.01)

(52) U.S. Cl.
CPC .. *H01L 21/76874* (2013.01); *H01L 21/76801* (2013.01); *H01L 21/76897* (2013.01); *H01L 23/528* (2013.01); *H01L 23/5226* (2013.01); *H01L 27/11556* (2013.01); *H01L 27/11582* (2013.01)

(58) Field of Classification Search
CPC ................................................. H01L 21/76874
See application file for complete search history.

(56) References Cited

U.S. PATENT DOCUMENTS

2011/0031630 A1* 2/2011 Hashimoto ....... H01L 27/11578
257/774
2011/0220861 A1* 9/2011 Himeno ............. H01L 27/2463
257/4

FOREIGN PATENT DOCUMENTS

| JP | 2011-035237 | 2/2011 |
| JP | 2014-022717 | 2/2014 |
| WO | 2010/050094 | 5/2010 |

* cited by examiner

*Primary Examiner* — Christopher A Johnson
(74) *Attorney, Agent, or Firm* — IPUSA, PLLC

(57) ABSTRACT

A method includes a step of performing a selective catalyst treatment by supplying a catalyst solution to an upper surface of an exposed interconnection layer forming a step portion of a stepped shape formed by pair layers stacked to form the stepped shape, the pair layer including an interconnection layer formed on an insulating layer, and a step of selectively growing a metal layer by performing electroless plating on the upper surface of the interconnection layer on which the catalyst treatment is performed.

28 Claims, 16 Drawing Sheets

METHOD FOR MANUFACTURING A CONTACT PAD, METHOD FOR MANUFACTURING A SEMICONDUCTOR DEVICE USING SAME, AND SEMICONDUCTOR DEVICE

TECHNICAL FIELD

The present disclosure relates to a method for manufacturing a contact pad, a method for manufacturing a semiconductor device using the same, and a semiconductor device.

BACKGROUND ART

Conventionally, in the fabrication of a three-dimensional stacked memory device having a step-like stacked structure of a dielectric layer/conductive layer, when forming an interlayer connector (contact plug) from a surface of the device to a conductive layer by etching, the number of masks and the number of etching steps increase by using a separate etching mask for each different contact level. Therefore, a method of forming an interlayer connector that requires only N masks to provide access to $2^N$ conductive layers by devising regions and procedures of etching is known (see, for example, Patent Document 1).

PRIOR ART DOCUMENTS

Patent Documents

Patent Document 1: Japanese Laid-Open Patent Application Publication No. 2014-22717 (U.S. Pat. No. 5,801,782) Public Bulletin

SUMMARY OF THE INVENTION

Problem to be Solved by the Invention

However, in the method of forming an interlayer connector disclosed in Patent Document 1, although the number of masks can be reduced rather than preparing masks for all different contact levels, there is still a problem of requiring N masks for forming $2^N$ interlayer connectors, and still requiring a large number of masks.

Therefore, the present disclosure is intended to provide a method for manufacturing a contact pad, a method for forming a semiconductor device using the same, and a semiconductor device capable of forming a contact plug at a small number of etching times without complicating an etching process.

Means for Solving the Problem

In order to achieve the above-described object, a method for manufacturing a contact pad according to an embodiment includes a step of performing a selective catalyst treatment by supplying a catalyst solution to an upper surface of an exposed interconnection layer forming a step portion of a stepped shape formed by pair layers stacked to form the stepped shape, the pair layer including an interconnection layer formed on an insulating layer, and a step of selectively growing a metal layer by performing electroless plating on the upper surface of the interconnection layer on which the catalyst treatment is performed.

Advantageous Effect of the Invention

According to the present disclosure, a contact pad can be famed on an interconnection layer and can prevent a punch through of the interconnection layer by etching.

EMBODIMENTS FOR IMPLEMENTING THE INVENTION

Hereinafter, embodiments for carrying out the present disclosure will be described with reference to the drawings.

First Embodiment

Figure 1:
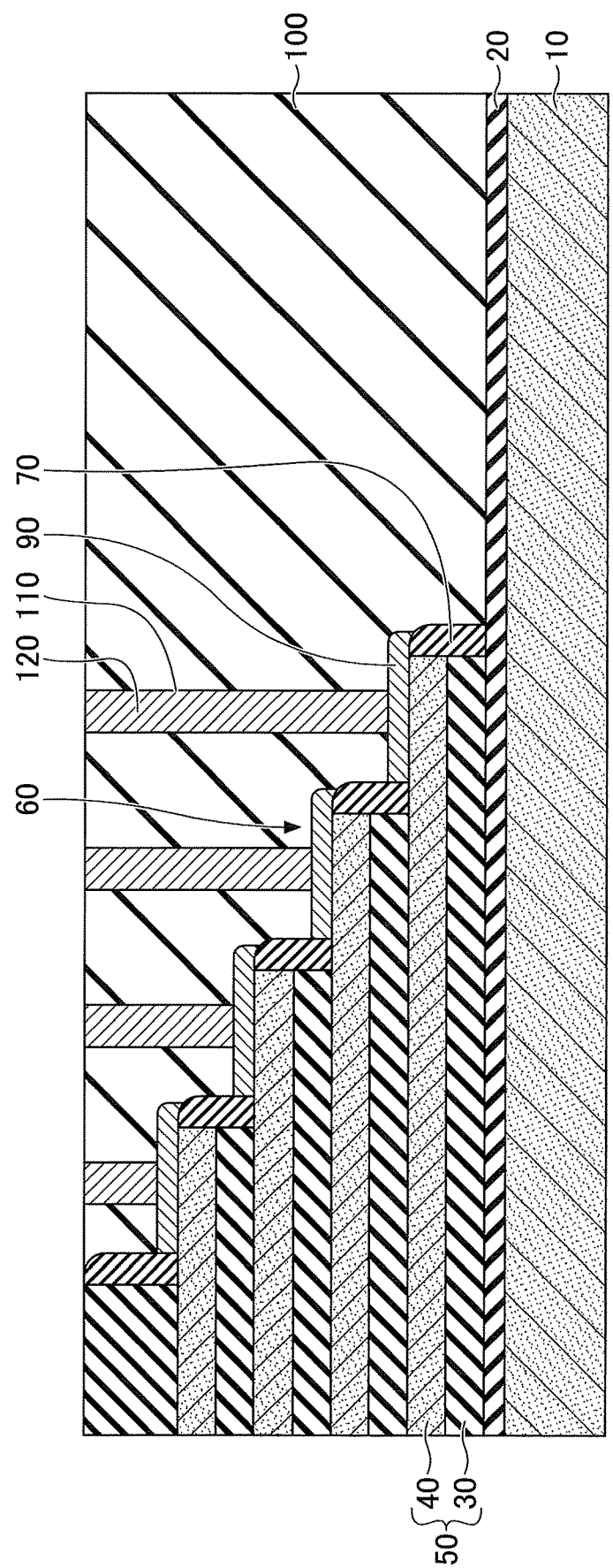
FIG. 1 is a diagram illustrating an example of a semiconductor device according to a first embodiment of the present disclosure.

FIG. 1 is a diagram illustrating an example of a semiconductor device according to a first embodiment of the present disclosure. The semiconductor device according to the first embodiment includes a substrate 10, a stop layer 20, insulating layers 30, interconnection layers 40, spacers 70, contact pads 90, an insulating film 100, contact holes 110, and contact plugs 120.

In the semiconductor device according to the first embodiment, the stop layer 20 is formed on a surface of the substrate 10, and a structure 60 having a stepped shape is formed on a surface of the stop layer 20. The structure 60 is formed by stacking pair layers 50 including the interconnection layers 40 formed on the insulating layers 30. That is, although the structure 60 is formed by alternately stacking the insulating layers 30 and the interconnection layers 40 as a whole, one step is formed by a unit of the pair layer 50 in the stepped shape. The stair-shaped step portions (portions of horizontal planes) are formed by exposing the top surfaces of the interconnection layers 40, and the level varying portions (portions of vertical planes) are formed by exposing the sides of the ends of the pair layer 50. The level varying portions of the structure 60 are covered with the spacers 70, and the step portions are covered with the contact pads 90. By providing the contact pads 90 on the exposed surfaces of the top surfaces of the interconnection layers 40, the portions are locally thick.

The insulating film 100 is formed on the surface of the structure 60 with spacers 70 on the sides and contact pads 90 on the top so as to fill all of the stair-shaped indentations, and the top surface of the insulating film 100 forms a flat surface. The flat surface of the upper surface may be a mirror polished surface. Vertically extending contact plugs 120 are disposed over the contact pads 90 in the insulating film 100. The contact plugs 120 are filled with a metallic material such as tungsten (W) to form plugs for interconnection. The contact plugs 120 are formed by etching contact holes 110 and filling the contact holes 110 with a metallic material. Because the structure 60 has a stepped shape, when a plurality of contact holes 110 is simultaneously etched, the contact holes 110 of the upper layers are completely formed first before the contact holes 110 of the lower layers are formed until reaching the lower contact pads 90.

Because the contact pad 90 is not conventionally provided, if the etching is continued, the punch through that forms a hole in the upper interconnection layer 40 is liable to occur. In the semiconductor device according to the present embodiment, the contact pads 90 are formed on the interconnection layer 40, and the contact pads 90 prevent the interconnection layers 40 from being etched and prevent such a punch-through from occurring. A metallic material having appropriate etch selectivity ratio is selected as the contact pads 90 to prevent the punch-through at the upper layer, even when a plurality of contact holes 110 having different etch depths are formed in a single time of etching. Accordingly, the plurality of contact holes 110 having different etching depths can be formed in the single time of etching using a single mask, thereby preventing the occurrence of defects and increasing productivity.

It should be noted that the semiconductor device according to the present embodiment may be preferably applied to a three-dimensional stacked memory device, that is, a three-dimensional NAND flash memory, but may be generally applied to a semiconductor device having a stepped structure or a different-level structure, regardless of the intended use. When the semiconductor device according to the present embodiment is applied to the three-dimensional stacked memory device, the interconnection layers 40 form a word line.

The foregoing is an outline of the semiconductor device according to the present embodiment, and each of the components will be described in more detail below.

The substrate 10 is a base for forming a semiconductor device on its surface. The substrate 10 may be, for example, a silicon substrate (silicon wafer) made of silicon.

The stop layer 20 is a layer for stopping the etching so that the etching does not develop further and is formed on the surface of the substrate 10. The stop layers 20 are, for example, made of silicon oxide ($SiO_2$). The stop layers 20 are disposed throughout the region that forms the semiconductor device according to the present embodiment.

The insulating layer 30 is a so-called interlayer insulating film, for example, made of $SiO_2$. The interconnection layer 40 is a conductive layer that forms the interconnection and is made of, for example, polysilicon. The insulating layer 30 and the interconnection layer 40 formed on the surface thereof form the pair layer 50. The pair layer 50 is a layer that is the unit of one step in forming the structure 60 having a stepped shape. That is, a single insulating layer 30 and a single interconnection layer 40 forms a single pair layer 50, and forms a single step.

The structure 60 is a stepped structure formed of pair layers 50. The three-dimensional stacked memory device is frequently formed while including the structure 60 having such a stepped shape. Because the insulating layer 30 that is the lower layer and the interconnection layer 40 that is the upper layer form one pair layer 50, the exposed surface constituting the step portion of the step shape becomes the upper surface of the interconnection layer 40. Meanwhile, in the level varying portion, both the insulating layer 30 and the interconnection layer 40 become the exposed surfaces, and the surface having a stacked structure including the interconnection layer 40 on the insulating layer 30 becomes the exposed surface.

The spacer 70 is an oxide film (insulating oxide film) disposed to prevent the contact pads 90 of the upper and lower stages from shorting. The spacer 70 is, for example, made of $SiO_2$. As will be described in detail below, the contact pad 90 is made of an electroless plating layer formed by selective electroless plating. The selective electroless plating here means electroless plating that adsorbs only on the surface of the silicon that constitutes the interconnection layer 40 but not on the $SiO_2$ film. Accordingly, the spacer 70 does not merely plays a role of the physical spacing, but also plays a role of inhibiting the chemical reaction, which means that the spacer 70 has a property of not forming the contact pad 90 thereon.

The contact pads 90 are selectively formed at locations where the contact holes 110 are formed, and play a role of covering the interconnection layer 40 to thicken the entire conductive region and preventing the interconnection layer 40 from being broken down by the punch-through. Thus, the contact pads 90 are made of a metallic material having a high etch-selective ratio with respect to the silicon oxide film and have a predetermined thickness to prevent the punch-through. It is desirable to have an optimized thickness because too thick contact pads 90 can adversely affect the design of the device. As will be described later, because the thickness of the contact pads 90 can be adjusted by a period of time of electroless plating, a processing temperature of an electroless plating solution and the like, the contact pads 90 having an appropriate thickness can be formed. The material of the contact pads 90 may be selected from metallic materials such as cobalt (Co), nickel (Ni), ruthenium (Ru), and aluminum (Al), and more specifically, cobalt may be used. Cobalt is appropriate for preventing the punch-through due to its high etch selective ratio to silicon oxide ($SiO_2$).

The insulating film 100 is an insulating film for filling a stepped depression and may be made of, for example, $SiO_2$.

The contact plugs 120 are interconnection plugs for providing electrical connections from the top surface of the semiconductor device to the interconnection layers 40 and are configured by filling the contact holes 110 formed in the insulating film 100 with a metallic material. The contact holes 110 are provided by forming through-holes at positions on the contact pads 90 in the insulating film 100 to electrically connect the top surface of the semiconductor device to the contact pads 90. The metallic material to be filled in the contact hole 110 may be of a variety of metallic materials depending on the intended use, for example, tungsten (W). The contact plugs 120 are electrically connected to the interconnection layers 40 via the contact pads 90.

Thus, according to the semiconductor device of the first embodiment, by providing the contact pads 90 on the exposed surfaces of the interconnection layers 40 constituting the step portions of the structure 60 having the stepped shape, the interconnection layers 40 are protected and the thickness of the interconnection region is thickened, and it is possible to prevent the interconnection layers 40 from being broken due to the occurrence of the punch-through during etching. Also, a plurality of contact holes 110 having different etching depths can be formed simultaneously in one time of etching, and the productivity of the semiconductor device can be increased.

Next, a method for manufacturing a semiconductor device according to a first embodiment of the present disclosure and a method for manufacturing a contact pad included therein will be described.

Figure 2:
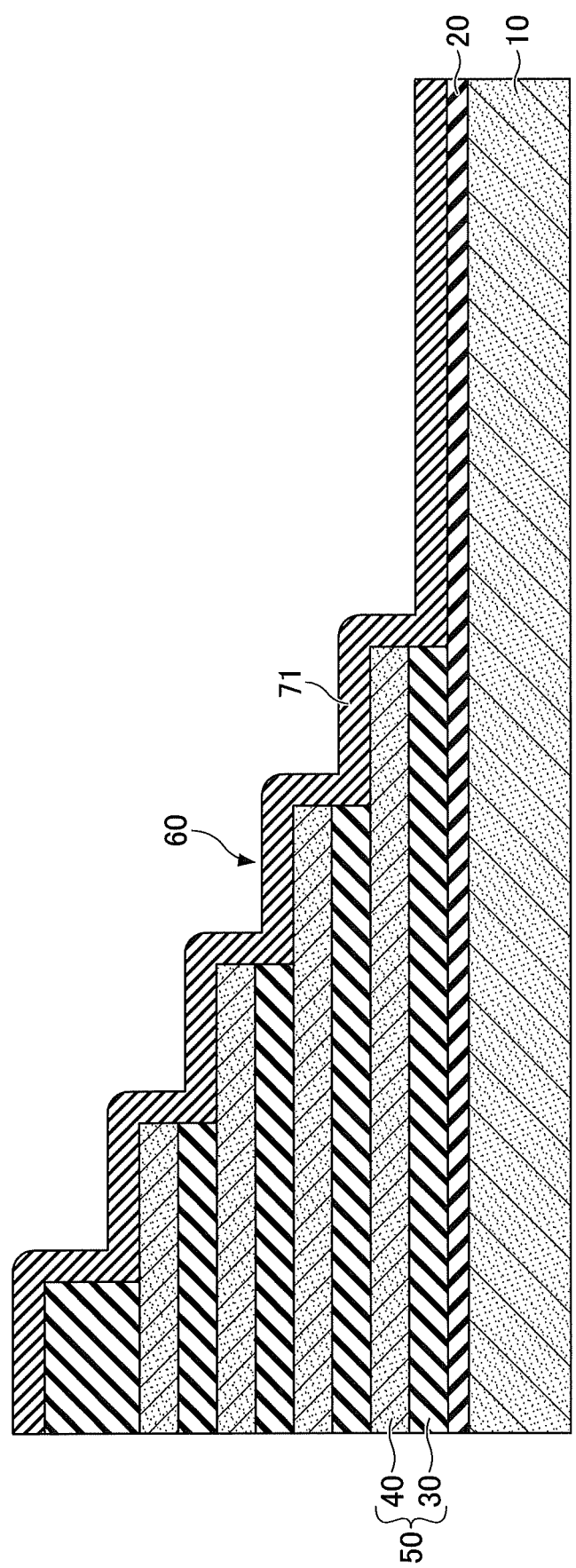
FIG. 2 is a diagram illustrating an example of an oxide film forming process of a method for manufacturing a semiconductor device according to a first embodiment.

FIG. 2 is a diagram illustrating an example of a first insulating film forming process of the method for manufacturing the semiconductor device according to the first embodiment. In the first insulating film forming process, an insulating film 71 is formed on the surface of the structure 60 having the stepped shape. The insulating film 71 is preferably formed along the shape of the structure 60 having the stepped shape because a part of the film is removed by etch-back in a later process. The insulating film 71 may be formed of various insulating films capable of serving as the spacers 70, and for example, a silicon oxide film $SiO_2$ may be formed. The insulating film 71 may be formed by various film deposition methods, but may be formed, for example, by CVD (Chemical Vapor Deposition).

Figure 3:
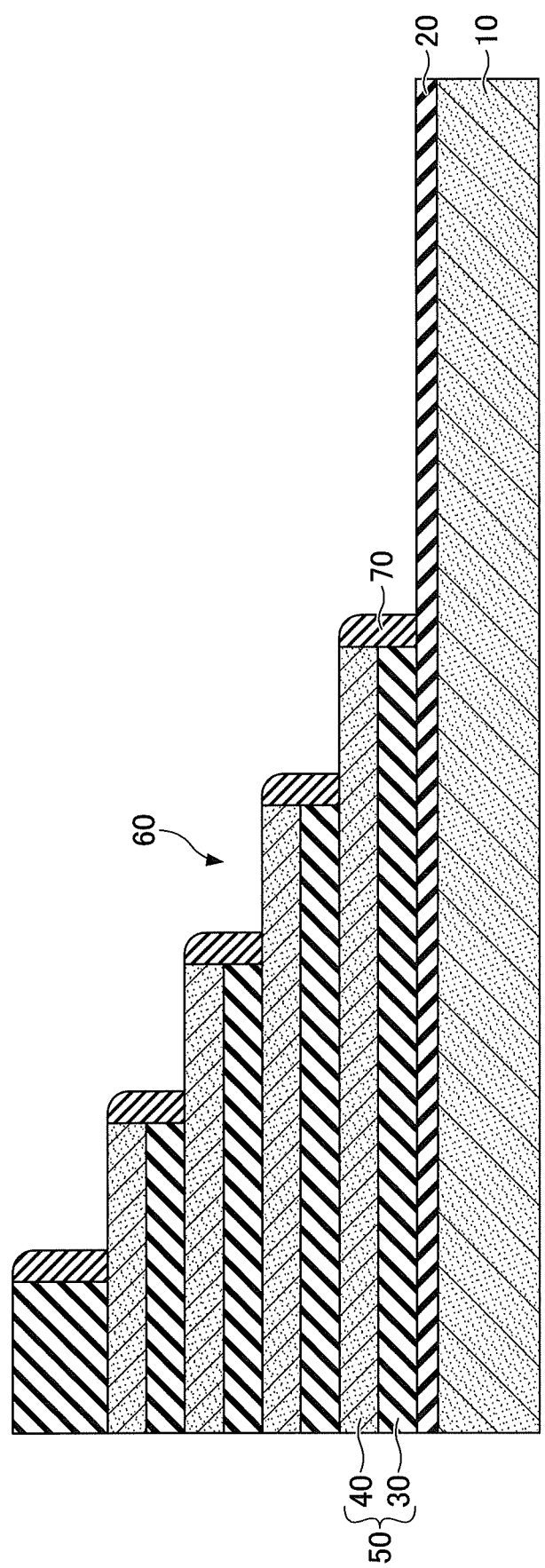
FIG. 3 is a diagram illustrating an example of a spacer forming process of a method for manufacturing a semiconductor device according to a first embodiment.

FIG. 3 is a diagram illustrating an example of a spacer forming process of the method for manufacturing the semiconductor device according to the first embodiment. In the spacer forming process, the insulating film 71 formed on the upper surface of the interconnection layers 40 forming the step portion of the stepped shape is removed by etch-back, and only the insulating film 71 covering the side surfaces of the pair layers 50 forming the level varying portion of the stepped shape is left, thereby forming the spacers 70. Here, the etch-back may be performed, for example, by RIE (Reactive Ion Etching). Because the etch-back requires only the insulating film 71 on the upper surface of the interconnection layers 40 to be precisely etched without etching the interconnection layers 40 and the insulating films 71 on the sides of the pair layers 50, dry etching is preferably performed.

When the contact pads 90 are formed by electroless plating as described above, the role of the spacers 70 are to prevent catalyst adsorption to the side surfaces of silicon forming the interconnection layers 40 and to prevent deposition of the electroless plating layer on the side walls, and to prevent the electroless plating layer from being connected to the contact pads 90 of the lower stage, thereby preventing a short circuit, even if the electroless plating layer overhangs.

Figure 4:
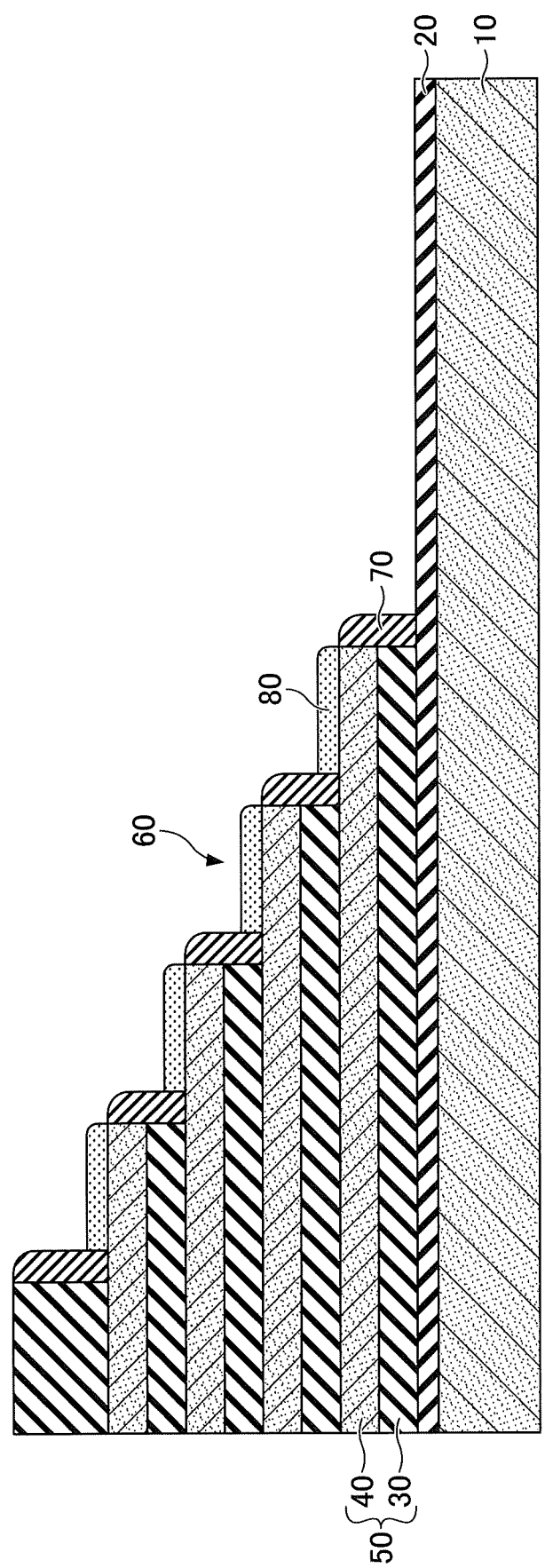
FIG. 4 is a diagram illustrating an example of a catalyst treatment process of a method for manufacturing a semiconductor device according to a first embodiment.

FIG. 4 is a diagram illustrating an example of a catalyst treatment process of a method for manufacturing a semiconductor device according to a first embodiment. In the catalyst treatment process, a catalyst solution 80 is supplied to the surface of the structure 60.

Incidentally, the catalyst solution 80 contains metal ions having catalytic activity against the oxidation reaction of the reducing agent in the plating solution. In an electroless plating process, the initial film surface (that is, the exposed surface of the interconnection layer 40) needs to have sufficient catalytic activity against the oxidation reaction of the reducing agent in the plating liquid in order to start the deposition of metal ions in the plating liquid. Examples of such catalysts include those containing iron group elements (Fe, Co, Ni), white metal elements (Ru, Rh, Pd, Os, Ir, Pt), Cu, Ag, or Au. Formation of a catalytically active metal film results from a substitution reaction. In the substitution reaction, the component constituting the plating surface serves as a reducing agent, and metal ions (e.g., palladium ions) in the catalytic liquid 80 are deposited on the plating surface. When the plated surface is silicon, silicon at the surface is replaced with palladium.

Thus, for example, a solution containing palladium, such as an ionic palladium solution, is supplied to the surface of the structure 60 as a catalyst solution 80. Here, palladium adsorbs only on the surface of silicon (including polysilicon) and does not adsorb on an insulating film (for example, $SiO_2$ film) such as an oxide film, and adsorbs only on the upper surface of the exposed interconnection layers 40. That is, palladium adsorbs only on the exposed portion of the interconnection layers 40 consisting of silicon in the step portion of the stepped shape. This is because palladium is replaced by Si at the surface. On the other hand, because palladium is not replaced by a $SiO_2$ film, palladium, which is the catalytic solution 80, does not adsorb on the surface of the spacers 70. Palladium may adsorb on the $SiO_2$ film, but palladium can be washed off by post-cleaning.

Because a thin silicon oxide film ($SiO_2$ film) is also formed when palladium is replaced by Si of a surface layer, hydrogen fluoride (HF) is preferably mixed in order to remove the thin silicon oxide film. A small amount of hydrogen fluoride may be mixed into, for example, in the range of 0.05% to 1%, and more specifically, at about 0.1%.

The catalyst solution 80 may be supplied by dipping the substrate 10 on which the structure 60 is formed in the catalyst solution 80 or by dropping the catalyst solution 80 to the surface of the substrate 10 including the structure 60. If necessary, after the catalyst treatment process, a post-cleaning may be performed.

Figure 5:
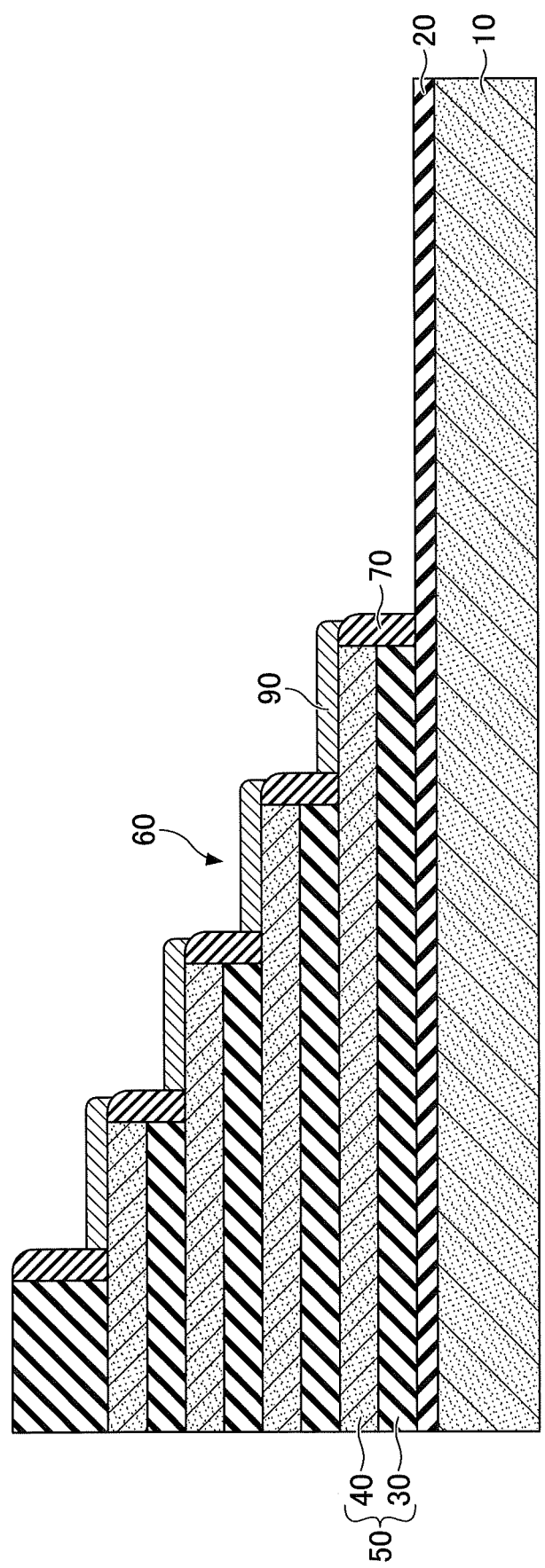
FIG. 5 is a diagram illustrating an example of an electroless plating process of a method for manufacturing a semiconductor device according to a first embodiment.

FIG. 5 is a diagram illustrating an example of an electroless plating process of the method for manufacturing the semiconductor device according to the first embodiment. In the electroless plating process, an electroless plating solution is supplied to the surface of the substrate 10 that includes the structure 60. Thus, the electroless plating layer selectively grows on a region processed by catalyst treatment, that is an exposed surface of the interconnection layers 40, and the contact pads 90 are formed. Here, in the electroless plating solution, if the etch selectivity ratio is preferable, an electroless plating solution containing various metallic elements may be selected. For example, an electroless plating solution containing cobalt, nickel, ruthenium, and aluminum may be used. More specifically, an electroless plating solution containing, for example, cobalt may be used. Incidentally, even if the electroless plating layer overhangs beyond the catalyst treatment range during growth, there is no risk of shorting to the lower contact pad 90 because the spacer 70 is present. Thus, by performing the electroless plating process after a selective catalyst process, the electroless plating layer can be grown selectively and a contact pads 90 can be selectively formed. Thus, contact pads 90 can be formed only above the exposed interconnection layers 40 to be etched during the formation of contact holes 110, and only the necessary interconnection region can be thickened without thickening the entire interconnection layers 40.

The thickness of the contact pad 90 can be adjusted depending on the period of time of performing the electroless plating process, the processing temperature, the concentration of the plating solution and the like. Thus, the contact pad 90 is formed with a predetermined thickness that does not cause punch-through by etching the contact hole 110 by allowing the appropriate thickness of the electroless plating layer to be grown in such a way that no punch-through occurs during the etching. It is desirable to have an optimized thickness because too thick contact pad 90 can adversely affect the design of the device. Here, the predetermined thickness of the electroless plating layer can be determined by considering the etching conditions, the etching selectivity ratio and the like.

As long as the catalytic solution 80 is supplied only to the upper surface of the exposed interconnection layer 40; the electroless plating layer is grown only at the point where the catalytic solution 80 is supplied in the electroless plating; and an overhang in which the electroless plating layer grows to the step portion at the lower stage can be prevented, the spacers 70 are not necessarily famed. The spacers 70 are provided to prevent the upper and lower contact pads 90 from shorting due to the growth of the electroless plating layer until the electroless plating layer overhangs. Accordingly, if such overhangs can be reliably prevented in the catalytic treatment process and the electroless plating process, the contact pads 90 can be formed without providing the spacers 70.

Here, the catalytic treatment process illustrated in FIG. 4 and the electroless plating process illustrated in FIG. 5 constitute the method for forming the contact pad 90. That is, the method for manufacturing the semiconductor device according to the present embodiment is configured using the method of manufacturing the contact pad 90 constituted of the catalytic treatment process of FIG. 4 and the electroless plating process of FIG. 5.

Figure 6:
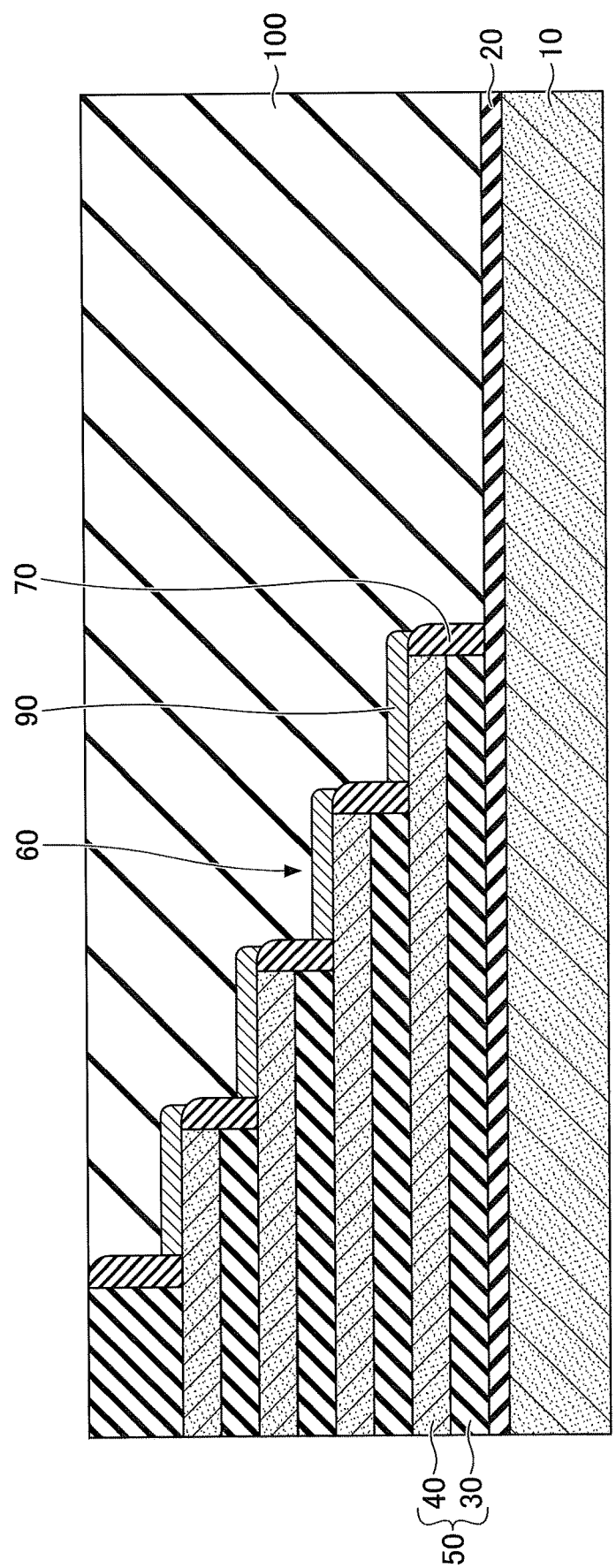
FIG. 6 is a diagram illustrating an example of an insulating film forming process of a method for manufacturing a semiconductor device according to a first embodiment.

FIG. 6 is a diagram illustrating an example of a second insulating film forming process of the method for manufacturing the semiconductor device according to the first embodiment. In the second insulating film forming process, the insulating film 100 is formed so as to fill all of the depressed regions of the structure 60 having the stepped shape. The insulating film 100 is formed to reach a top insulating layer 30. The insulating film 100 is formed, for example, of SiO2.

The insulating film 100 can be formed by various film deposition methods, for example, by CVD or by spin-on glass (SOG). In addition, after the insulating film 100 is formed, the upper surface of the insulating film 100 is preferably mirror-polished and planarized by CMP (Chemical Mechanical Polishing).

Because the second insulating film forming process is a process of filling the depression portion of the stepped shape of the structure 60 with the insulating film 100, the second insulating film forming process may be referred to as the insulating film filling process. In this case, the first insulating film forming process is simply referred to as an insulating film forming process.

Subsequently, the contact holes 110 are etched as described in FIG. 1, and the formed contact holes 110 are filled with a metallic material to form the contact plugs 120. Here, because the etching is performed to provide an electrical connection with the interconnection layers 40 including the step portion of the structure 60 having the stepped shape, a plurality of contact holes 110 having different etching depths needs to be formed. In the semiconductor device according to the first embodiment, the interconnection layers 40 are covered with the contact pads 90, and the interconnection rejoins are formed thick by adding the thicknesses of the contact pads 90 to the interconnection layers while protecting the interconnection layers 40 by the contact pads 90 made of a metallic layer having high etching selectivity ratio. Thus, multiple contact holes 110 with different etch depths can be formed without causing punch-through of the interconnection layers 40 in a single time of etching. Because the semiconductor device, the method for manufacturing the contact pad, and the method for manufacturing the semiconductor device according to the embodiments of the present disclosure are intended to provide a semiconductor device capable of forming a plurality of contact holes 110 having different etching depths without generating the punch-through of the interconnection layers 40 with a small number of etches (for example, only once), details of the etching process and the conductive material filling process will not be described or illustrated. The etching may, for example, employ conventional dry etching, such as RIE described above, and an appropriate etching method may be employed depending on the intended use. In addition, the filling of the conductive material can be performed by selecting an appropriate method from a variety of methods, such as a wet process such as plating and a film-forming process using a process gas such as CVD or ALD.

Second Embodiment

Referring to FIGS. 7 to 13, a method for manufacturing a semiconductor device according to a second embodiment of the disclosure and a method for manufacturing a contact pad therein will be described. In the second embodiment, when a portion overlapping or similar to the first embodiment is found, the description is omitted. For the components corresponding to the components according to the first embodiment, the description thereof is omitted using the same reference numerals.

Figure 7:
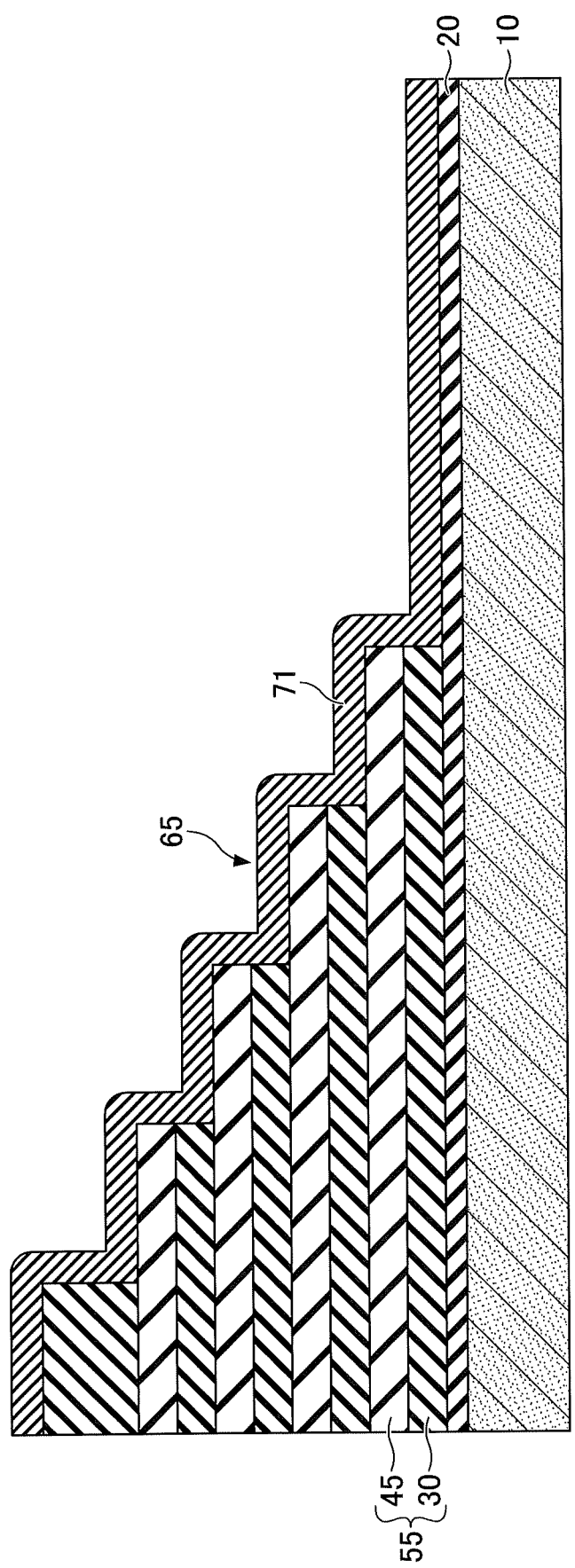
FIG. 7 is; a diagram illustrating an example of an oxide film forming process of a method for manufacturing a semiconductor device according to a second embodiment.

FIG. 7 is a diagram illustrating an example of an oxide film forming process of the method for manufacturing the semiconductor device according to a second embodiment. The method for manufacturing the semiconductor device according to the second embodiment differs from the method for manufacturing the semiconductor device according to the first embodiment in that interconnection layers 45 made of a silicon nitride film (SiN) are formed on the insulating layers 30 to form pair layers 55. The silicon nitride film is a type of insulating film and does not serve as the interconnection layers 45 without modification, but is eventually removed and replaced by a conductive interconnection material to function as the interconnection layers 45. For example, a silicon oxide film (SiO$_2$) may be used as the insulating layers 30 similar to the method for manufacturing the semiconductor device according to the first embodiment. Accordingly, in the first stage, the pair layers 55 are famed of different types of insulating films in the stacked structure.

The point that the pair layer 55 forms a structure 65 having a stepped shape is the same as that in the first embodiment. Therefore, similar to the first embodiment, the structure 65 has a structure in which the top surfaces of the interconnection layers 45 constituting the step portion having a stepped shape are exposed, and the sides of the stacked portion of the insulating layers 30 and the interconnection layers 45 constituting the step portion having the stepped shape are exposed. In addition, because the points that a stop layer 20 is formed on a surface of a substrate 10 and that the structure 65 is formed thereon are the same as those in the first embodiment, the same reference numerals are put to the corresponding components and the description thereof is omitted.

In the oxide film forming process, as described in FIG. 2 of the first embodiment, an oxide film 71 is formed on the surface of the structure 65 having the stepped shape using a film deposition method such as CVD. The oxide film 71 may be, for example, a silicon oxide film (SiO$_2$). Further, the preferable point that the oxide film 71 is formed along the stepped shape of the structure 65 is the same as that described in the first embodiment.

Figure 8:
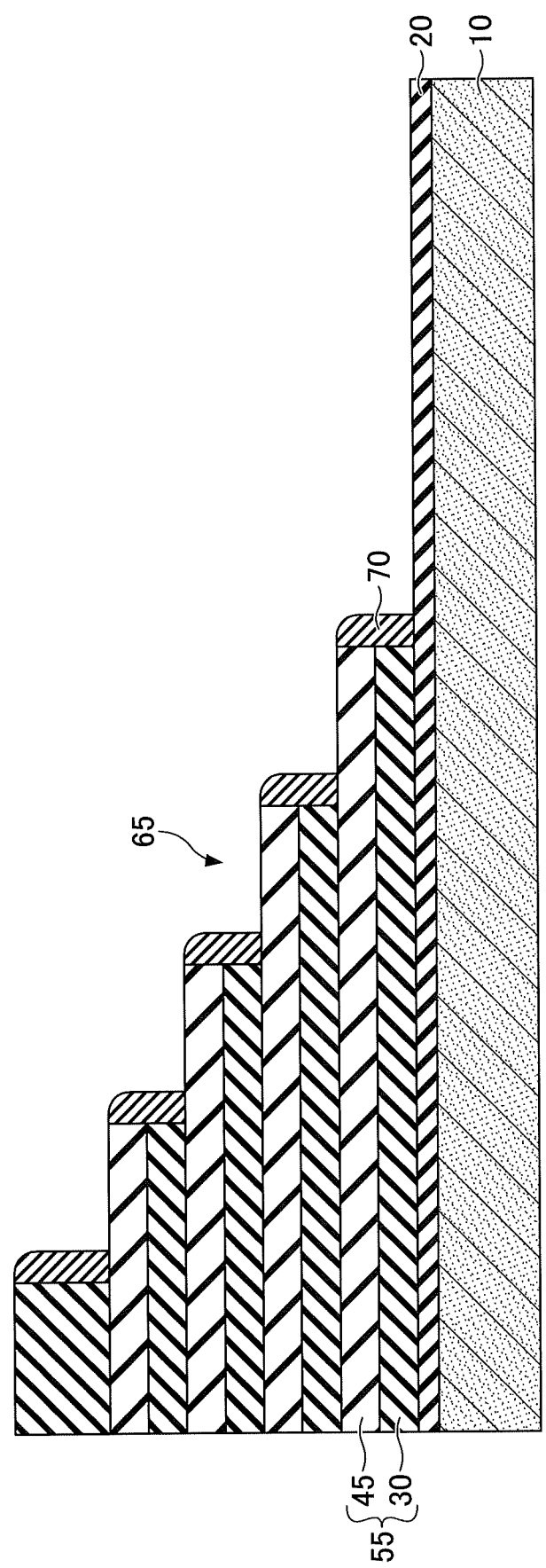
FIG. 8 is a diagram illustrating an example of a spacer forming process of a method for manufacturing a semiconductor device according to a second embodiment.

FIG. 8 is a diagram illustrating an example of a spacer forming process of the method for manufacturing the semiconductor device according to the second embodiment. In the spacer forming process, the oxide film 71 formed on the upper surface of the interconnection layers 45 forming the step portion of the stepped shape is removed by etch back, only the oxide film 71 covering the side surfaces of the pair layers 50 forming the level varying portion of the stepped shape is left, and the spacers 70 are formed. This exposes the upper surfaces of the interconnection layers 45 made of the silicon nitride film, which form the step portion of the stepped shape. In contrast, the sides of the pair layers 55 are covered with the spacers 70 made of an oxide film.

Because the spacer forming step and the role of the spacer are the same as those described with reference to FIG. 3 in the method for manufacturing the semiconductor device according to the first embodiment, the description thereof is not repeated.

Figure 9:
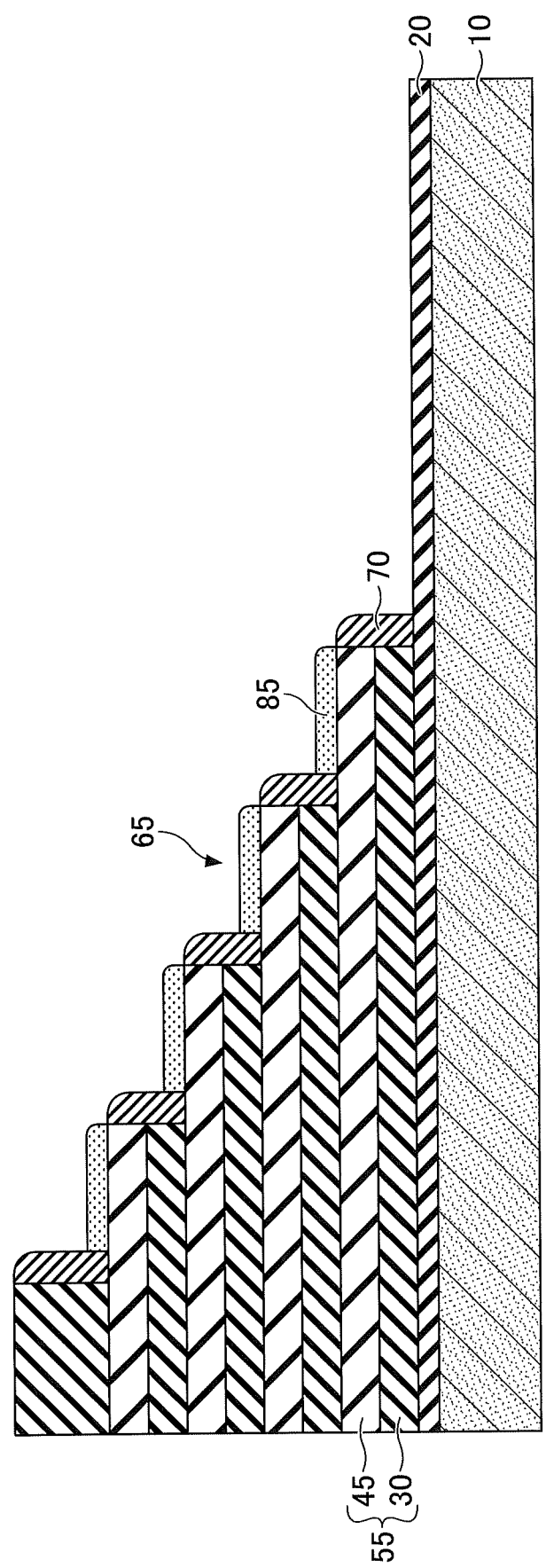
FIG. 9 is a diagram illustrating an example of a catalyst treatment process of a method for manufacturing a semiconductor device according to a second embodiment.

FIG. 9 is a diagram illustrating an example of a catalyst treatment process of the method for manufacturing the semiconductor device according to the second embodiment. In the catalyst treatment process, a catalyst solution 85 is supplied to the surface of the structure 65 in a manner similar to the method for manufacturing the semiconductor device and the method for manufacturing the contact pad according to the first embodiment.

However, the method of manufacturing the contact pad according to the second embodiment may use a catalyst solution 85 containing a nanoparticulate metal catalyst. Specifically, the catalyst solution 85 may include a metal catalyst in the form of nanoparticles (for example, palladium in the form of nanoparticles), a dispersant, and an aqueous solution. When the surface to be plated is a silicon nitride film, nanoparticulate palladium is adsorbed on the surface of the silicon nitride film. Therefore, in the method of manufacturing the contact pad according to the second embodiment using the interconnection layers 45 made of the silicon nitride film, for example, a nanopalladium solution may be used as the catalytic solution 85.

As the catalytic solution 85, a solution containing not only nanopalladium solution but also nanoparticles of ferrous elements (Fe, Co, Ni), platinum elements (Ru, Rh, Pd, Os, Ir, Pt), Cu, Ag, or Au can be used. This is the same as the method for manufacturing the contact pad according to the first embodiment. In these cases, the nanoparticles of each metal are adsorbed on the surface of the silicon nitride film.

This selectively supplies a catalyst to the surface to be plated, which is made of a silicon nitride film, and forms a metal film having catalytic activity on the plating material. On the other hand, because each of the metals has a property difficult to adsorb on SiO$_2$, the catalyst is not substantially supplied to the spacers 70 made of SiO$_2$, and a metal film having catalytic activity is not formed. Therefore, by using each of the metals as a catalyst, it is possible to selectively deposit the plating metal on the surface to be plated made of silicon nitride.

Because the other points are the same as the description of FIG. 4 in the first embodiment, the description thereof is not repeated.

Figure 10:
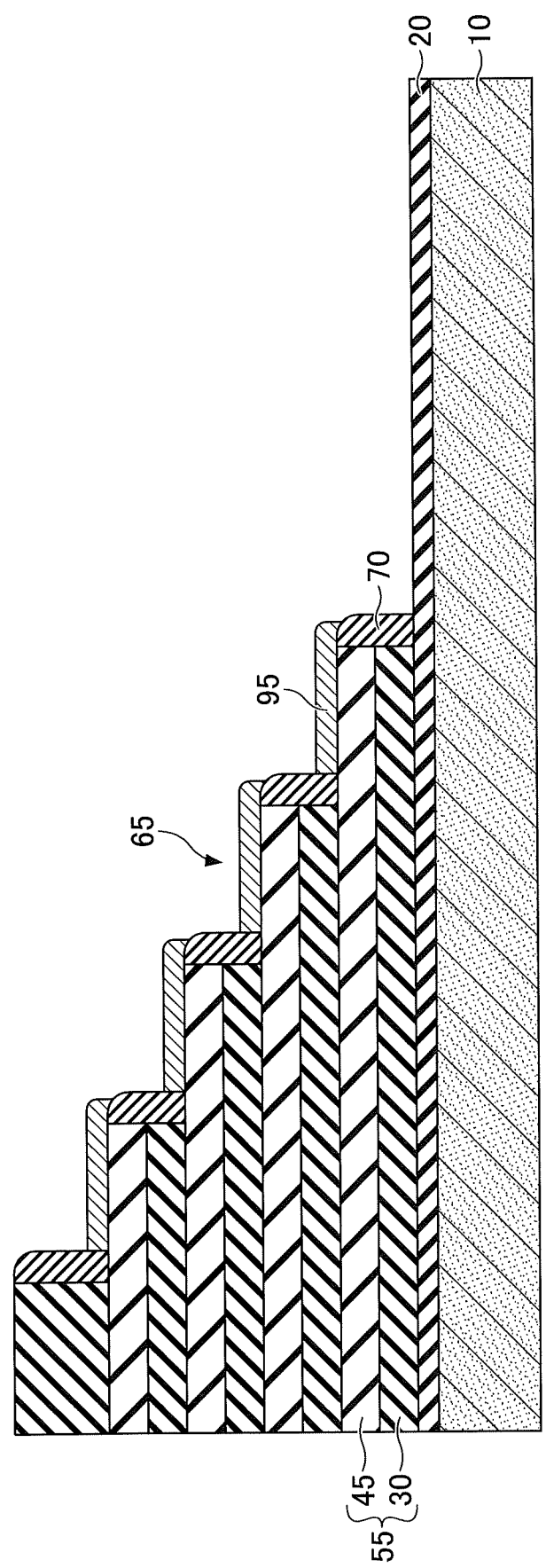
FIG. 10 is a diagram illustrating an example of an electroless plating process of a method for manufacturing a semiconductor device according to a second embodiment.

FIG. 10 is a diagram illustrating an example of an electroless plating process of the method for manufacturing the semiconductor device according to the second embodiment. In the electroless plating process, an electroless plating solution is supplied to the surface of the substrate 10 containing the structure 65. This causes the electroless plating layer to selectively grow on the catalyzed region, which is the exposed surface of the interconnection layers 45, and the contact pads 95 are formed. The contact pads 95 differ from the contact pads 90 of the first embodiment only in that the catalyst solution 85 is a solution using nanoparticles, and are considered to be little different from the contact pads 90 of the first embodiment in the selective growth.

Because the electroless plating process is the same as that of FIG. 5 according to the first embodiment, the description thereof is not repeated.

The contact pads 95 are formed on the exposed surfaces of the interconnection layers 45 made of the silicon nitride film by the electroless plating process.

The catalytic treatment process of FIG. 9 and the electroless plating process of FIG. 10 constitute a method for manufacturing a contact pad according to the second embodiment.

Figure 11:
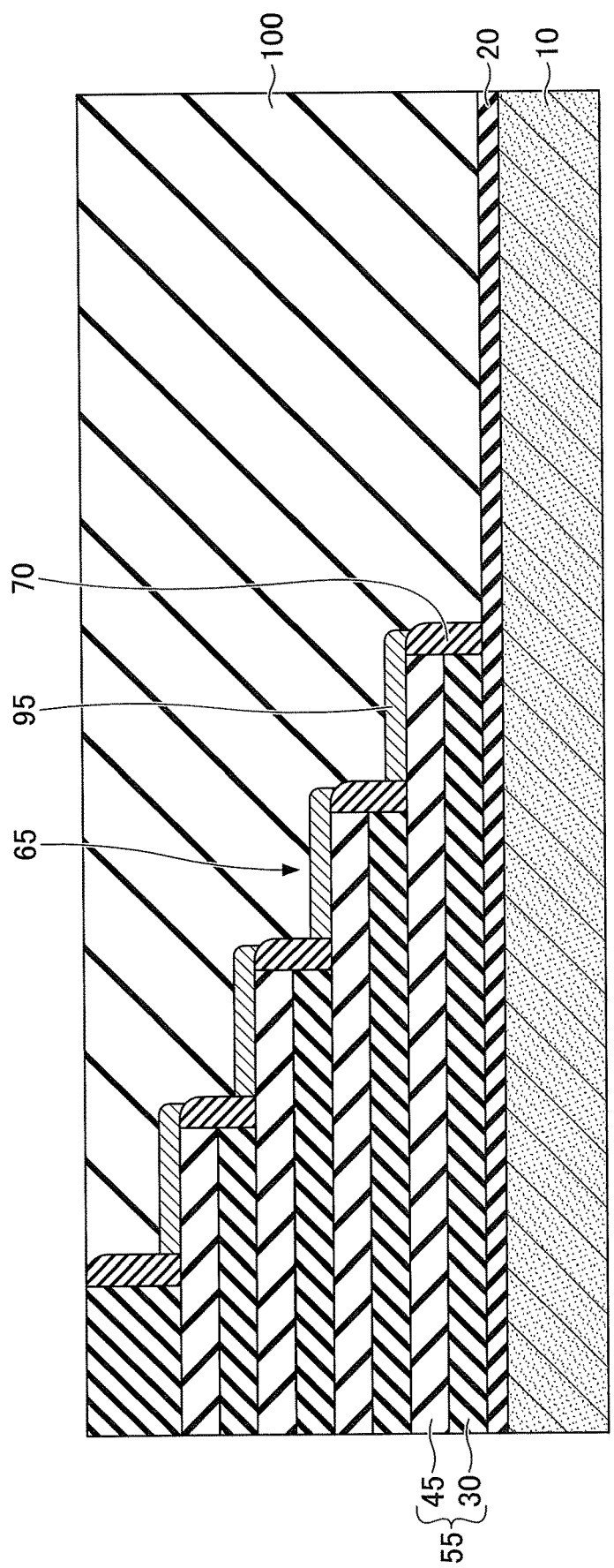
FIG. 11 is a diagram illustrating an example of an insulating film forming process of a method for manufacturing a semiconductor device according to a second embodiment.

FIG. 11 is a diagram illustrating an example of an insulating film forming process of the method for manufacturing the semiconductor device according to the second embodiment. In the insulating film forming process, the insulating film 100 is formed so as to fill all of the depressed regions of the structure 65 having the stepped shape.

Because the insulating film forming process is the same as that of FIG. 6 according to the first embodiment, the description thereof is not repeated.

Figure 12:
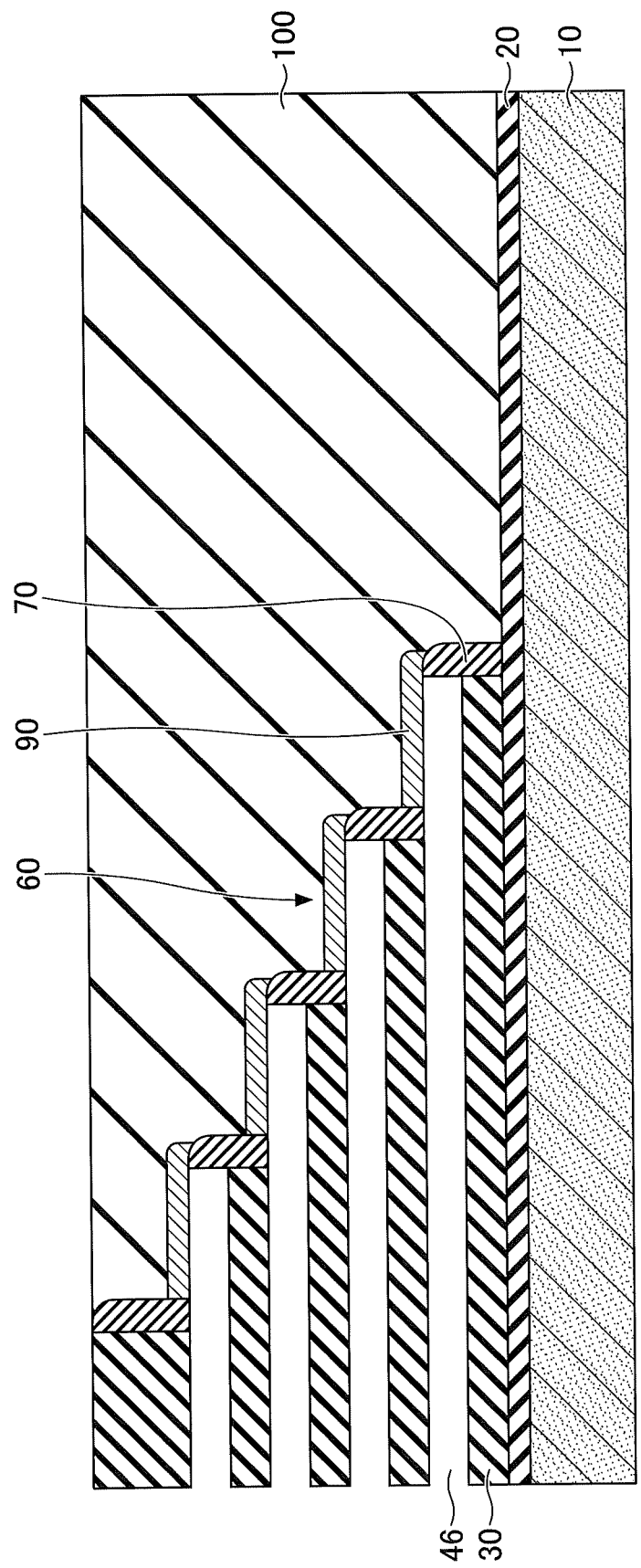
FIG. 12 is a diagram illustrating an example of an interconnection layer removal process of a method for manufacturing a semiconductor device according to a second embodiment.

FIG. 12 is a diagram illustrating an example of an interconnection layer removal process of the method for manufacturing the semiconductor device according to the second embodiment. In the interconnection layer removal step, the silicon nitride films faulting the interconnection layers 45 are removed, and spaces 46 (cavities) are formed in a portion of the interconnection layers 45. As described above, because the silicon nitride film is an insulating film, the silicon nitride film needs to be replaced by a conductive material finally. Therefore, in order to secure the regions of the interconnection layers 45, the silicon nitride films that have been provided as the temporary interconnection layers 45 are removed, and spaces 46 for filling in the conductive material are formed.

The silicon nitride films may be removed by various methods, and for example, the silicon nitride films may be removed by wet etching using hot phosphoric acid. Wet etching using hot phosphoric acid is a method commonly used to remove the silicon nitride films, and the silicon nitride films can be easily and reliably removed.

Figure 13:
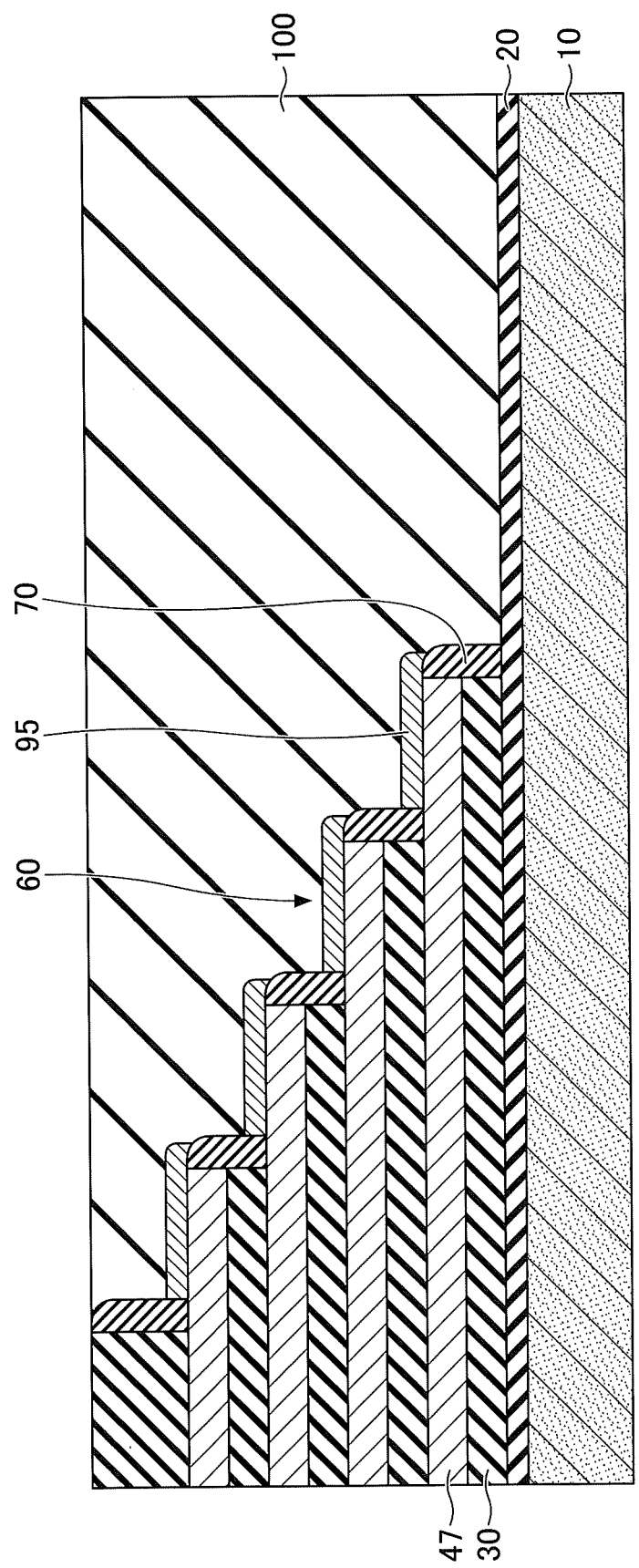
FIG. 13 is a diagram illustrating an example of an interconnection layer forming process of a method for manufacturing a semiconductor device according to a second embodiment.

FIG. 13 is a diagram illustrating an example of an interconnection layer forming process of the method for manufacturing the semiconductor device according to the second embodiment. In the interconnection layer forming process, the spaces 46 formed in the interconnection layer removal process are filled with a conductive material, and interconnection layers 47 are famed.

The interconnection layers 47 may be made of a variety of materials among conductive materials, and may be made of, for example, a metallic material. Also, a variety of film deposition methods or filling methods may be used for filling a conductive material depending on the intended use.

For example, the filling deposition may be performed by CVD or ALD (Atomic Layer Deposition) using titanium nitride (TiN) as a liner and tungsten (W) as a bulk.

Alternatively, the interconnection layers 47 may be formed by electroless plating. As described above, the contact pads 95 are formed by electroless plating and the interconnection layers 47 can be grown from the electroless plating layers of the contact pads 95. Because seamless growth can be performed, the reliability can be improved.

The interconnection layers 47, when the method for manufacturing the semiconductor device according to the present embodiment is applied to a three-dimensional stacked memory device (three-dimensional NAND flash memory), form word lines, similar to the description in the first embodiment.

Thereafter, contact holes 110 are etched as described in FIG. 1 of the first embodiment. Because the contact pads 95 are famed in the stepped portions of the interconnection layers 47, even when etching of different etching depths is performed simultaneously, the punch-through in the upper layer can be prevented.

While the above-described three-dimensional stacked memory devices include a type that uses polysilicon as a control gate to charge thereon and a type that uses a tungsten gate, the semiconductor device, the method for manufacturing the contact pad and the method for manufacturing the semiconductor device according to the first embodiment can be appropriately applied to a three-dimensional stacked memory device of the type that uses polysilicon as the control gate. Meanwhile, the semiconductor device, the method for manufacturing the contact pad and the semiconductor device according to the second embodiment can be appropriately applied to a three-dimensional stacked memory device of the type using the tungsten gate. Thus, the semiconductor device and the method for manufacturing the semiconductor device and the contact pad according to the first embodiment, and the semiconductor device and the method for manufacturing the semiconductor device and the contact pad can be appropriately applied depending on the intended use.

Third Embodiment

Next, a method for manufacturing a semiconductor device according to a third embodiment will be described. Because the method for manufacturing the semiconductor device according to the third embodiment is similar to the method for manufacturing the semiconductor device according to the second embodiment until forming the interconnection layers 45 using a silicon nitride film and forming the contact pads 95, the description thereof is omitted while putting the same numerals to the corresponding components, and only different processes is described below.

Figure 14:
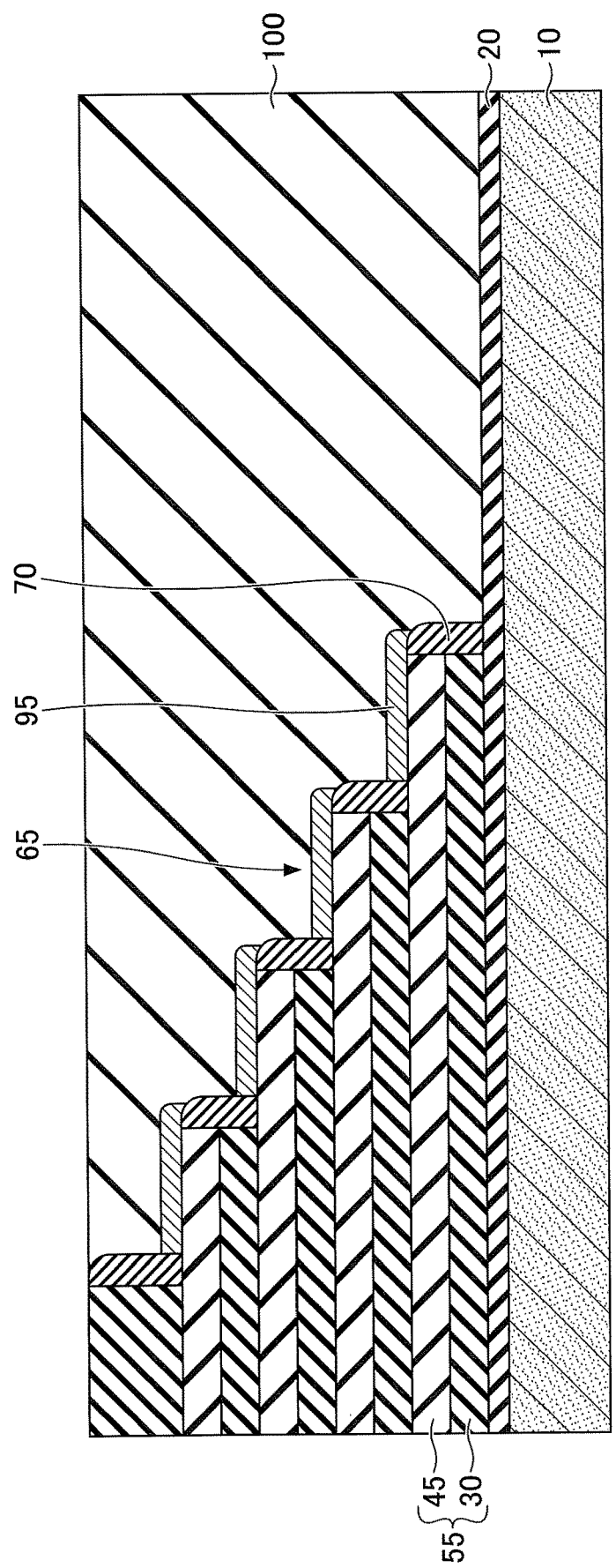
FIG. 14 is a diagram illustrating a state after a contact pad forming process in a method for manufacturing a semiconductor device according to a second embodiment.

FIG. 14 is a diagram illustrating a state of completing a contact pad forming process and forming contact pads 95. Because the processes until now are similar to those of the method for manufacturing the contact pad and the method for manufacturing the semiconductor device according to the second embodiment, the description is omitted while putting the same reference numerals to the corresponding components.

Figure 15:
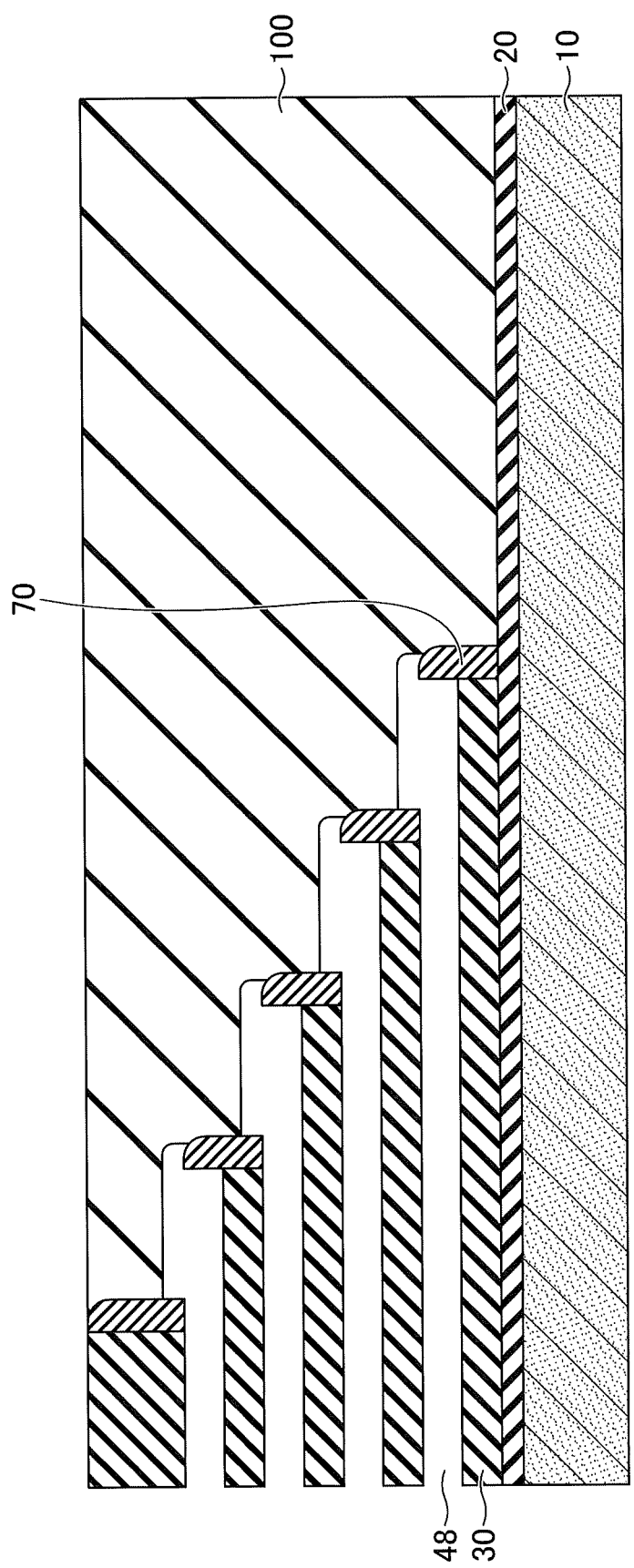
FIG. 15 is a diagram illustrating an example of an interconnection layer removal process of a method for manufacturing a semiconductor device according to a third embodiment.

FIG. 15 is a diagram illustrating an example of an interconnection layer removal process of the method for manufacturing the semiconductor device according to the third embodiment. In the interconnection layer removal process according to the third embodiment, not only the silicon nitride films of the interconnection layers 45 but also the metal layers of the contact pads 95 are removed, and spaces (cavities) 48 are formed in the region where the interconnection layers 45 and the contact pads 95 were present. The interconnection layers 45 and the contact pads 95 may be removed by various methods. For example, when the contact pads 95 are made of cobalt, the silicon nitride films and the cobalt electroless plating layers may be removed by wet etching using hot phosphoric acid and sulfuric acid, and the spaces 48 may be formed.

Figure 16:
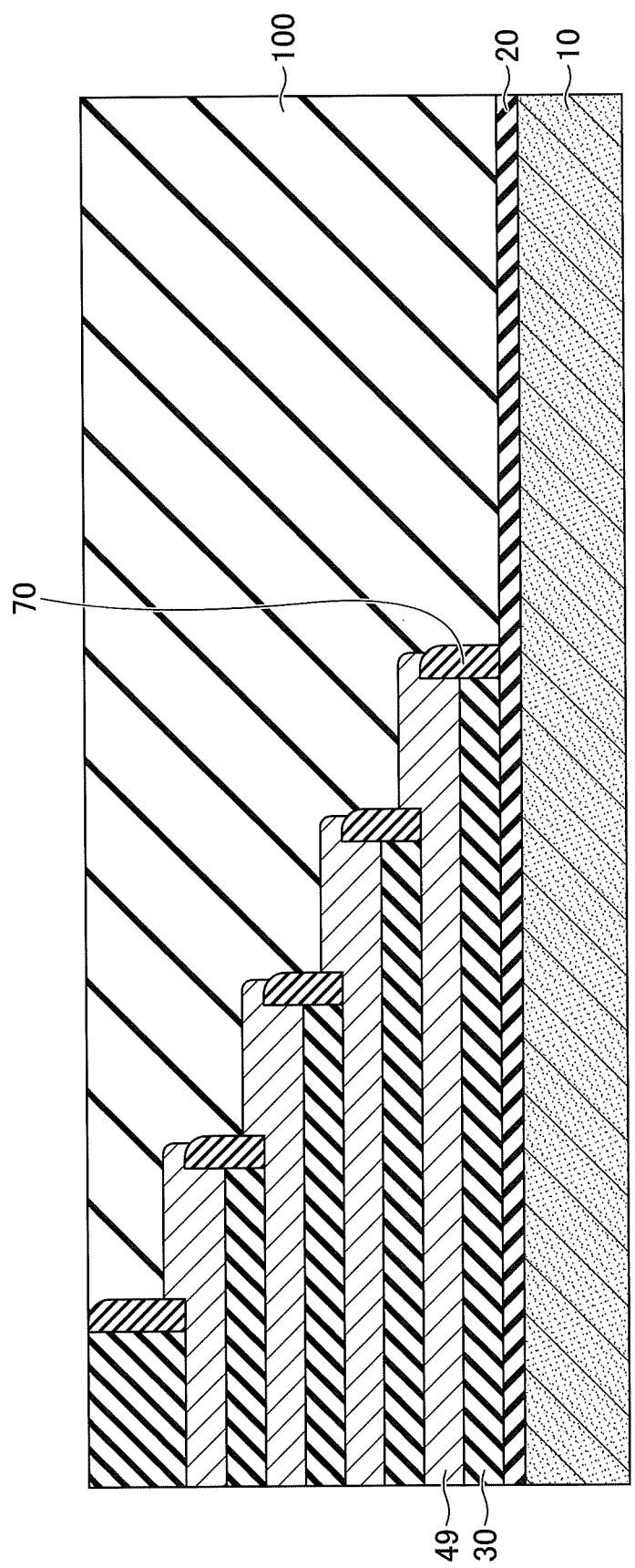
FIG. 16 is a diagram illustrating an example of an interconnection layer forming process of a method for manufacturing a semiconductor device according to a third embodiment.

FIG. 16 is a diagram illustrating an example of an interconnection layer forming process of the method for manufacturing the semiconductor device according to the third embodiment. In the interconnection layer forming process in the third embodiment, the entire spaces 48 are filled with an electrically conductive material and interconnection layers 49 are formed.

Similar to the second embodiment, the interconnection layers 49 may be made of a variety of materials, for example, a metallic material, among conductive materials. A variety of film deposition methods or filling methods may be used for filling the conductive material depending on the intended use. However, the spaces 48 cannot be filled by electroless plating because all the inner wall surfaces are made of an insulating film and no conductive material is present. Accordingly, the spaces 48 are filled by, for example, a film deposition method using a process gas such as CVD or ALD.

For example, the filling deposition may be performed by CVD or ALD (Atomic Layer Deposition) using titanium nitride (TiN) as a liner and tungsten (W) as a bulk. Because the spaces of the contact pads 95 are widened at deeper portions than the portion of the interconnection layers 45, there is a concern that voids may easily be formed when the filling deposition is performed by CVD, ALD or the like, but contact resistance can be reduced because the filling deposition can be performed using a single metal with a low resistance and no joint is present.

Thus, when the contact resistance is desired to be decreased, the semiconductor device having a low resistance can be manufactured by using the method for manufacturing the semiconductor device according to the third embodiment.

Because the point of forming contact holes 110 thereafter is the same as that of the first and second embodiments, the description is omitted.

According to the methods for manufacturing the contact pad, the methods for manufacturing the semiconductor device, and the semiconductor devices according to embodiments of the present disclosure, the contact pads 90, 95 may be formed in the exposed portions of the interconnection layers 40, 45 of the step portions of the structures 60, 65 having the stepped shape to provide a semiconductor device capable of forming a plurality of contact holes 110 in a single etching process while preventing punch-through of the interconnection layers 40, 45 by protecting the interconnection layers 40, 45. In the stepped structures 60, 65, all the contact holes 110 may be formed in a single etching process, or multiple contact holes 110 with different depth levels may be grouped and etched the grouped several times.

Also, in the first to third embodiments, although the processes where the interconnection layers 40 and 45 are made of silicon or silicon nitride have been described, a material of the interconnection layers 40 and 45 are not limited as long as the contact pads 90 and 95 can be formed in the step portion of the stepped shape of the structure 60 by selective electroless plating. The method for manufacturing the contact pad, the method for manufacturing the semiconductor device and the semiconductor device according to the first embodiment, are applicable to various modes including an interconnection layer 40 made of an electrically conductive material. Because the method for manufacturing the contact pad, the method for manufacturing the semiconductor device and the semiconductor device according to the second and third embodiments finally replace the interconnection layer 45 by a conductive material, various materials including an insulating material can be used as the interconnection layer 45. That is, if the catalyst solution 80 and the electroless plating solution are appropriately selected depending on the materials of the interconnection layers 40 and 45, and the contact pads 90 and 95 can be formed by selectively growing the electroless plating layer only on the step portion of the stepped shape of the structures 60 and 65, it is applicable to the process using the interconnection layers 40 and 45 of various materials.

While the preferred embodiments of the present disclosure have been described in detail above, the present disclosure is not limited to the embodiments described above, and various modifications and substitutions can be made to the embodiments described above without departing from the scope of the claims.

The present application claims priority to Priority Application No. 2017-044808, filed on Mar. 9, 2017 with the Japan Patent Office, the entire contents of which are herein incorporated by reference.

DESCRIPTION OF THE REFERENCE NUMERALS 10 substrate
20 stop layer
30 insulating layer
40, 45, 47, 49 interconnection layer
46, 48 space
50, 55 pair layer
60, 65 structure
70 spacer
71 oxide film
80, 85 catalyst solution
90, 95 contact pad
100 insulating film
110 contact hole
120 contact plug

The invention claimed is:

1. A method for manufacturing a contact pad, comprising:
a step of performing a selective catalyst treatment by supplying a catalyst solution to an upper surface of an exposed interconnection layer forming a step portion of a stepped shape formed by pair layers stacked to form the stepped shape, the pair layer including an interconnection layer formed on an insulating layer; and
a step of selectively growing a metal layer by performing electroless plating on the upper surface of the interconnection layer on which the catalyst treatment is performed.

2. The method for manufacturing the contact pad as claimed in claim 1, wherein the metal layer is formed to a predetermined thickness that prevents a punch through by etching.

3. The method for manufacturing the contact pad as claimed in claim 1, wherein the interconnection layer is made of silicon or silicon nitride.

4. The method for manufacturing the contact pad as claimed in claim 3, wherein a lateral surface of the pair layer forming a level varying portion of the stepped shape is preliminarily covered with a spacer of an insulating film.

5. The method for manufacturing the contact pad as claimed in claim 4, wherein the catalyst solution contains a metal element that adsorbs silicon or silicon nitride film but does not adsorb on the insulating film.

6. The method for manufacturing the contact pad as claimed in claim 5, wherein the metal element contained in the catalyst solution is any of Fe, Co, Ni, Ru, Rh, Pd, Os, Ir, Pt, Cu, Ag or Au.

7. The method for manufacturing the contact pad as claimed in claim 6,
wherein the metal element contained in the catalyst is palladium,
wherein an ion palladium liquid containing palladium in an ion state is used as the catalyst solution upon using silicon as the interconnection layer, and
wherein a nano palladium liquid containing palladium in a nanoparticle state upon using silicon nitride as the interconnection layer.

8. The method for manufacturing the contact pad as claimed in claim 3, wherein the catalyst solution contains hydrogen fluoride.

9. The method for manufacturing the contact pad as claimed in claim 4, wherein the insulating film and the spacer are made of a silicon oxide film.

10. The method for manufacturing the contact pad as claimed in claim 1, wherein the electroless plating is performed using an electroless plating liquid containing any of cobalt, nickel, ruthenium, and aluminum.

11. A method for manufacturing a semiconductor device, comprising:
a step of forming a first insulating film on an upper surface of a structure formed into a stepped shape along the stepped shape, the stepped shape of the structure being formed by stacking pair layers each including an interconnection layer formed on an insulating layer, the upper surface of the interconnection layer forming a step portion of the stepped shape and being exposed;
a step of forming a spacer by removing the first insulating film on the upper surface of the exposed interconnection layer;
a step of selectively performing a catalyst treatment by supplying a catalyst solution to the upper surface of the exposed interconnection layer;

a step of forming a contact pad by selectively growing a metal layer by performing electroless plating on the upper surface of the interconnection layer on which the catalyst treatment is performed; and a step of forming a second insulating film on the upper surface of the structure to fill the stepped shape, the second insulating film reaching a top stage of the stepped shape.

12. The method for manufacturing the semiconductor device as claimed in claim 1, wherein the metal layer is formed to a predetermined thickness that prevents a punch through by etching.

13. The method for manufacturing the semiconductor device as claimed in claim 11, wherein the electroless plating is performed using an electroless plating liquid containing any of cobalt, nickel, ruthenium, and aluminum.

14. The method for manufacturing the semiconductor device as claimed in claim 11, wherein the interconnection layer is made of silicon or silicon nitride.

15. The method for manufacturing the semiconductor device as claimed in claim 14, wherein the catalyst solution contains a metal element that adsorbs on silicon or silicon nitride but does not adsorb on the first insulating film.

16. The method for manufacturing the semiconductor device as claimed in claim 15, wherein the first and second insulating films are made of a silicon oxide film.

17. The method for manufacturing the semiconductor device as claimed in claim 16, wherein the metal element contained in the catalyst solution is any of Fe, Co, Ni, Ru, Rh, Pd, Os, Ir, Pt, Cu, Ag or Au.

18. The method for manufacturing the semiconductor device as claimed in claim 17, wherein the catalyst solution contains hydrogen fluoride.

19. The method for manufacturing the semiconductor device as claimed in claim 14,
wherein the interconnection layer is made of silicon, and an ion palladium liquid is used as the catalyst solution.

20. The method for manufacturing the semiconductor device as claimed in claim 14, wherein the interconnection layer is made of silicon nitride, and a nano palladium liquid is used as the catalyst solution.

21. The method for manufacturing the semiconductor device as claimed in claim 20, further comprising:
a step of removing the silicon nitride and forming a space in a region of the interconnection layer after the step of forming the second insulating film, and
a step of filling the space formed in the region of the interconnection layer with an electrically conductive material.

22. The method for manufacturing the semiconductor device as claimed in claim 21, wherein the silicon nitride is removed by wet etching using thermal phosphoric acid.

23. The method for manufacturing the semiconductor device as claimed in claim 20, further comprising:
a step of removing the silicon nitride and the metal layer and forming a space in a region of the interconnection layer and the contact pad after the step of forming the second insulating film, and
a step of filling the space formed in the region of the interconnection layer and the contact pad with an electrically conductive material.

24. The method for manufacturing the semiconductor device as claimed in claim 23, wherein the silicon nitride and the metal layer are removed by wet etching using thermal phosphoric acid and sulfuric acid.

25. A semiconductor device comprising:
a structure including pair layers stacked to form a stepped shape, the pair layers each including an interconnection layer formed on an insulating layer;
a spacer disposed to cover a lateral surface of the stepped shape forming a level varying portion; and
a contact pad made of an electroless plating layer disposed to cover an upper surface of the interconnection layer forming a step portion of the stepped shape,
wherein the interconnection layer and the contact pad are made of different types of electrically conductive materials from each other, and
wherein the interconnection layer is made of tungsten, and the contact pad is made of a metal material other than the tungsten.

26. The semiconductor device as claimed in claim 25, wherein the contact pad has a predetermined thickness that prevents a punch through from occurring by etching.

27. A semiconductor device, comprising:
a structure including pair layers stacked to form a stepped shape, the pair layers each including an interconnection layer formed on an insulating laver;
a spacer disposed to cover a lateral surface of the stepped shape forming a level varying portion; and
a contact pad made of an electroless plating layer disposed to cover an upper surface of the interconnection layer forming a step portion of the stepped shape,
wherein the interconnection layer and the contact pad are made a same type of electrically conductive material.

28. The semiconductor device as claimed in claim 27, wherein the electrically conductive material is tungsten.

* * * * *